(12) United States Patent
Chen et al.

(10) Patent No.: US 12,289,870 B2
(45) Date of Patent: Apr. 29, 2025

(54) SMART FLOW RATE CONTROL SYSTEM FOR COOLING SERVER RACKS

(71) Applicant: META Green Cooling technology Co., Ltd., Taoyuan (TW)

(72) Inventors: Keng-Han Chen, Taipei (TW); Chia-Chien Chu, Taipei (TW)

(73) Assignee: META Green Cooling technology Co., Ltd., Taoyuan (TW)

( * ) Notice: Subject to any disclaimer, the term of this patent is extended or adjusted under 35 U.S.C. 154(b) by 380 days.

(21) Appl. No.: 17/865,428

(22) Filed: Jul. 15, 2022

(65) Prior Publication Data
US 2023/0413493 A1     Dec. 21, 2023

(30) Foreign Application Priority Data
Jun. 16, 2022   (TW) .................................. 111122334

(51) Int. Cl.
*H05K 7/20*    (2006.01)
(52) U.S. Cl.
CPC ..... *H05K 7/20836* (2013.01); *H05K 7/20272* (2013.01); *H05K 7/20781* (2013.01)
(58) Field of Classification Search
CPC .......... H05K 7/20836; H05K 7/20272; H05K 7/20781; H05K 7/20281
USPC ......................................................... 165/294
See application file for complete search history.

(56) References Cited

U.S. PATENT DOCUMENTS

| | | | |
|---|---|---|---|
| 2009/0229784 A1* | 9/2009 | Rohr ..................... | F24F 13/222 165/301 |
| 2013/0105139 A1* | 5/2013 | Campbell .......... | H05K 7/20836 165/300 |
| 2014/0133099 A1* | 5/2014 | Campbell .......... | H05K 7/20818 361/698 |
| 2021/0378151 A1* | 12/2021 | Gao ..................... | H05K 7/2079 |

* cited by examiner

*Primary Examiner* — Steve S Tanenbaum

(57) ABSTRACT

A smart flow rate control system includes a cabinet, liquid cooling rear door, liquid cooling pipeline, temperature sensing device and flow rate control device. The liquid cooling rear door includes a door frame and a rear door cooling pipeline. The rear door cooling pipeline is mounted inside the door frame. The liquid cooling pipeline includes an admitting three-way valve, admitting branch pipe, discharging three-way valve and discharging branch pipe. The admitting three-way valve receives cooling liquid and delivers it to the admitting branch pipe and rear door inlet. The discharging three-way valve receives the cooling liquid from the rear door outlet and discharging branch pipe, respectively, and discharges it. The flow rate control device determines the flow ratio of the rear door cooling pipeline according to the temperature sensed. The smart flow rate control system overcomes drawbacks about removal of hot air current generated by servers.

10 Claims, 6 Drawing Sheets

SMART FLOW RATE CONTROL SYSTEM FOR COOLING SERVER RACKS

CROSS-REFERENCE TO RELATED APPLICATION

This non-provisional application claims priority under 35 U.S.C. § 119(a) on Patent Application No(s). 111122334 filed in Taiwan, R.O.C. on Jun. 16, 2022, the entire contents of which are hereby incorporated by reference.

BACKGROUND OF THE INVENTION

1. Field of the Invention

The present application relates to cooling equipment, and in particular to a smart flow rate control system for cooling server racks.

2. Description of the Related Art

Owing to technological advancements, servers are increasingly robust, though at the cost of their increasingly strict heat dissipation requirements. The heat dissipation requirements of conventional servers can be met by air cooling, because of low component power. With component heating power being on the rise, existing prior art suggests supplementing air cooling with liquid cooling to augment heat dissipation. Thus, a machine room which houses a server is often equipped with air cooling devices and liquid cooling devices concurrently, but the air cooling devices and liquid cooling devices were purchased at different points in time.

The air cooling devices and liquid cooling devices always generate hot air current, however small it may be. The hot air current thus generated burdens an air conditioning system of the machine room. Studies show that a liquid cooling device can only remove about 70% of the heat generated by a server, whereas the remaining 30% of the heat has to be dissipated in the form of hot air current and mostly with the air cooling device. Even if the heat is removed with the liquid cooling device and the air cooling device, the machine room will be hot in its entirety. Furthermore, the operating air conditioning system contributes to more power consumption for lowering the temperature of the machine room.

BRIEF SUMMARY OF THE INVENTION

In view of the aforesaid drawbacks of the conventional cooling equipment, it is an objective of the application to provide a smart flow rate control system for cooling server racks conducive to reduction in hot air current generated by cooling equipment of any type.

In order to achieve the above and other objectives, the application provides a smart flow rate control system for cooling server racks, comprising: a cabinet having a receiving space; a liquid cooling rear door comprising a door frame and a rear door cooling pipeline, the door frame being disposed on a side of the cabinet, the rear door cooling pipeline being mounted in place inside the door frame and having a rear door inlet and a rear door outlet; a liquid cooling pipeline comprising an admitting three-way valve, an admitting branch pipe, a discharging three-way valve and a discharging branch pipe, the admitting three-way valve receiving a liquid from an outside and delivering the liquid to the admitting branch pipe and the rear door inlet, and the discharging three-way valve receiving the liquid from the rear door outlet and the liquid from the discharging branch pipe, allowing the liquids to be joined before being discharged to the outside; a temperature sensing device; and a flow rate control device disposed at the liquid cooling pipeline, being in signal connection with the temperature sensing device, and determining a flow ratio of the rear door cooling pipeline according to a temperature sensed by the temperature sensing device.

In an embodiment of the application, the flow rate control device is disposed at the discharging three-way valve.

In an embodiment of the application, the flow rate control device is disposed at the admitting three-way valve.

In an embodiment of the application, the temperature sensing device is disposed in the receiving space to sense air temperature in the receiving space.

In an embodiment of the application, the temperature sensing device comprises a plurality of air temperature sensors disposed in the receiving space and corresponding in position to servers, respectively.

In an embodiment of the application, the temperature sensing device is disposed at the rear door cooling pipeline to sense water temperature in the rear door cooling pipeline.

In an embodiment of the application, the temperature sensing device comprises a plurality of water temperature sensors disposed at the rear door cooling pipeline and the discharging branch pipe, respectively.

In an embodiment of the application, the admitting three-way valve and the discharging three-way valve are disposed on an outer side of the cabinet.

In an embodiment of the application, the admitting three-way valve and the discharging three-way valve are disposed in the receiving space.

In an embodiment of the application, the door frame is pivotally rotatable relative to the cabinet.

Therefore, a smart flow rate control system for cooling server racks of the application is compatible with servers which come with different cooling devices and allows the heat generated by the servers to be quickly admitted into the rear door cooling pipeline and carried away by the cooling liquid, so as to lower the temperature of the cabinet and the machine room and lessen the workload of the air conditioning system. Therefore, the application embodies a technology of environmental protection and energy saving.

DETAILED DESCRIPTION OF THE INVENTION

The application is hereunder illustrated with specific embodiments, depicted with accompanying drawings, and described below to enable persons skilled in the art to gain insight into the objectives, features, and advantages of the application. The application can be implemented or applied in accordance with any other variant embodiments. Details presented herein may be modified or changed from different perspectives and for different applications without departing from the spirit of the application. The embodiments presented below are further descriptive of the technical features of the application rather than restrictive of the claims of the application.

Figure 1:
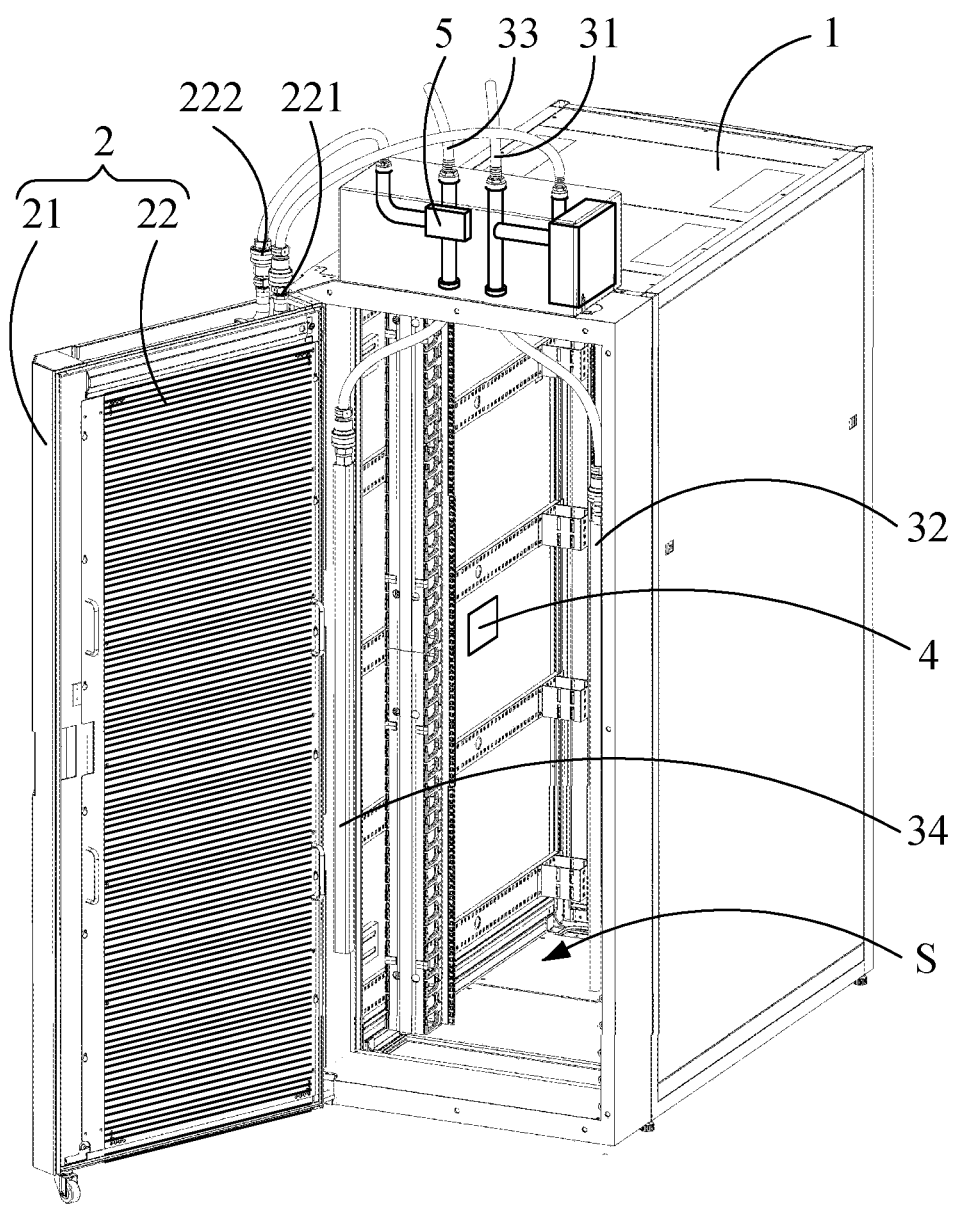
FIG. 1 is a perspective view of a smart flow rate control system for cooling server racks according to the first embodiment of the application.
Figure 2:
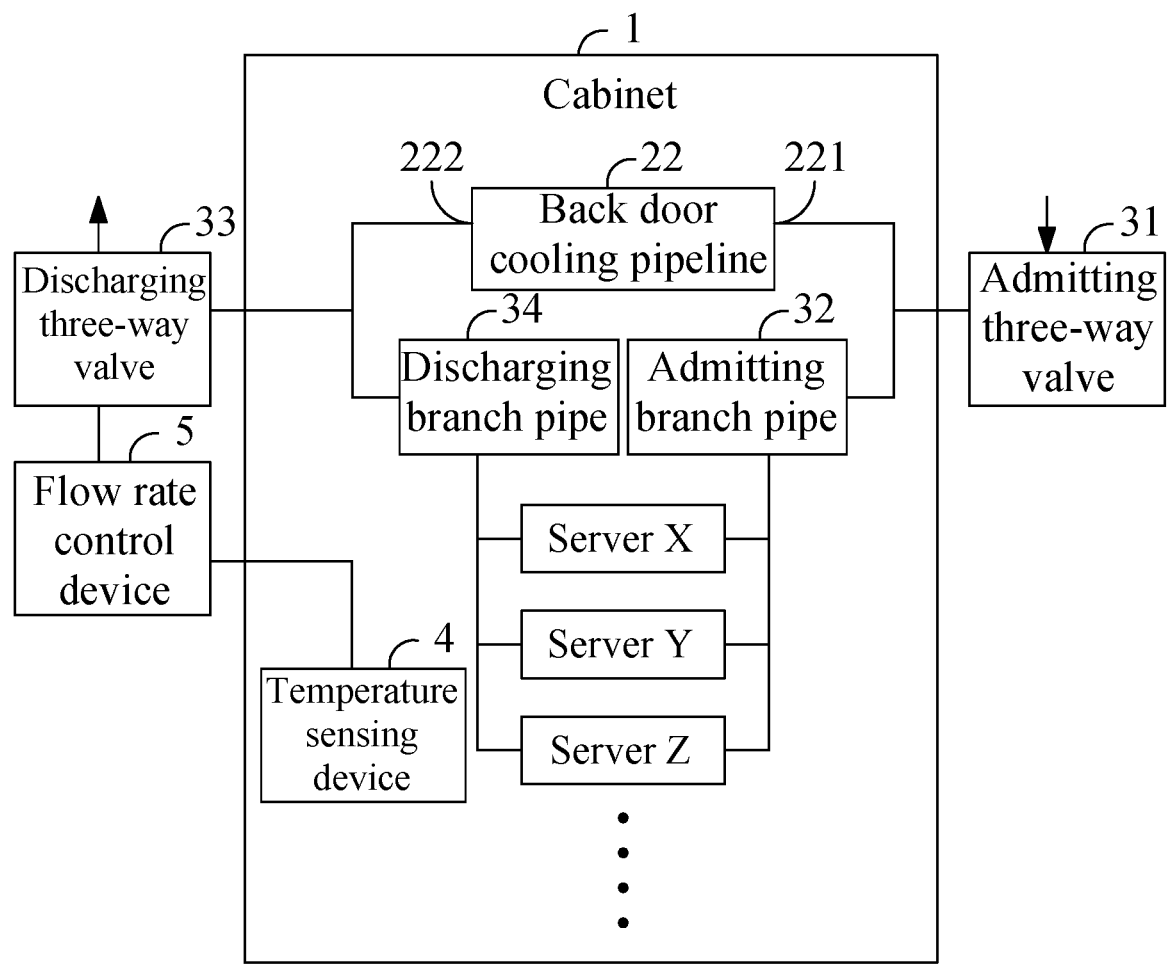
FIG. 2 is a block diagram of the smart flow rate control system for cooling server racks according to the first embodiment of the application.

Referring to FIG. 1 and FIG. 2, the first embodiment of the application provides a smart flow rate control system for cooling server racks 100 comprising a cabinet 1, a liquid cooling rear door 2, a liquid cooling pipeline 3, a temperature sensing device 4 and a flow rate control device 5.

The cabinet 1 has a receiving space S for accommodating a plurality of servers X, Y, Z, etc. The plurality of servers X, Y, Z each have a dedicated cooling device, including but not limited to an air cooling or liquid cooling device.

The liquid cooling rear door 2 comprises a door frame 21 and a rear door cooling pipeline 22. The door frame 21 is disposed on a side of the cabinet 1 and is preferably pivotally rotatable relative to the cabinet 1. The rear door cooling pipeline 22 is mounted in place inside the door frame 21. Liquid for use in cooling flows within the rear door cooling pipeline 22. Preferably, the rear door cooling pipeline 22 comprises a plurality of cooling pipes with large surface area conducive to heat exchange and extension of the duration of the flow of the liquid within the cooling pipes. The rear door cooling pipeline 22 has a rear door inlet 221 and a rear door outlet 222 to admit and discharge the cooling liquid, respectively. In this embodiment, the rear door cooling pipeline 22 comprises a plurality of cooling pipes connected in series or in parallel. However, the application is not limited thereto. In a variant embodiment, the rear door cooling pipeline 22 comprises coils or cooling pipes conducive to heat exchange. Heat exchange takes place at the rear door cooling pipeline 22, such that the cooling liquid in the rear door cooling pipeline 22 takes in the heat generated by the servers in the receiving space S to achieve heat dissipation.

The liquid cooling pipeline 3 comprises an admitting three-way valve 31, an admitting branch pipe 32, a discharging three-way valve 33 and a discharging branch pipe 34. The admitting three-way valve 31 and discharging three-way valve 33 are disposed on an outer side of the cabinet 1 as shown in FIG. 1. However, the application is not limited thereto. In a variant embodiment, the admitting three-way valve 31 and the discharging three-way valve 33 are disposed in the receiving space S. Thus, the application is not restrictive of the positions of the admitting three-way valve 31 and the discharging three-way valve 33.

The admitting three-way valve 31 has three communicating openings, namely one incoming opening, and two outgoing openings. The incoming opening receives a cooling liquid from the outside, and the cooling liquid thus received leaves the two outgoing openings for the admitting branch pipe 32 and rear door inlet 221. The admitting branch pipe 32 not only receives the cooling liquid from the admitting three-way valve 31 but also has a plurality of parallel discharge holes connected to liquid cooling devices (not shown) of servers. The cooling liquid exits the discharge holes and enters the liquid cooling devices, respectively.

The discharging branch pipe 34 also has a plurality of parallel admission holes connected to the liquid cooling devices of the servers. The admission holes admit the liquid which has already undergone heat exchange. The discharging three-way valve 33 also has three communicating openings, namely two incoming openings, and one outgoing opening. The two incoming openings receive the cooling liquid from the rear door outlet 222 and the cooling liquid from the discharging branch pipe 34, respectively, and then the cooling liquids thus received join each other at the outgoing opening before being discharged to the outside.

The admitting three-way valve 31 and the discharging three-way valve 33 not only allow the cooling liquid to be delivered to the liquid cooling devices but also allow the cooling liquid to be delivered to the rear door cooling pipeline 22. The rear door cooling pipeline 22 absorbs the waste heat within the receiving space S, thereby effectively lowering the temperature of the air current discharged from the cabinet 1.

The smart flow rate control system for cooling server racks 100 of the application is capable of regulating flow rate automatically and smartly in accordance with the performance of the servers, as described below.

The temperature sensing device 4 is a temperature sensing instrument of any type, for example, thermocouple, resistive temperature sensor, semiconductor temperature sensor or crystal oscillator. The flow rate control device 5 is disposed at the liquid cooling pipeline 3 and is in signal connection with the temperature sensing device 4. The flow rate control device 5 is, for example, a circuit board or a chip with a logic circuit.

The cabinet 1 has therein various servers. Each server has a cooling device, for example, a liquid cooling device or air cooling device. Thus, the cabinet 1 has therein a non-specific number of liquid cooling devices or air cooling devices concurrently. The performance of the servers is ever-changing. The flow rate control device 5 determines the flow ratio of the rear door cooling pipeline 22 according to the temperature sensed by the temperature sensing device 4. The flow ratio is the ratio of flow rate of water allocated to the rear door cooling pipeline 22 to the total flow rate of water.

For instance, in the first embodiment of the application, as shown in FIG. 1 and FIG. 2, the temperature sensing device 4 is disposed in the receiving space S to sense the temperature in the receiving space S. When the temperature in the receiving space S is higher than a predetermined target temperature or higher than the temperature outside the cabinet 1, the flow rate control device 5 increases the flow ratio of the rear door cooling pipeline 22. The size of the two incoming openings of the discharging three-way valve 33 is adjustable. The flow ratio of the rear door cooling pipeline 22 can be increased by increasing the distance between the rear door outlet 222 and the openings of the discharging three-way valve 33 mechanically or electrically to enhance the heat exchange in the receiving space S. Conversely, when the temperature in the receiving space S is low, the distance between the rear door outlet 222 and the openings of the discharging three-way valve 33 is decreased, or the distance between the discharging branch pipe 34 and the openings of the discharging three-way valve 33 is increased. Thus, the flow rate of the cooling device and the rear door cooling pipeline 22 is adjustable and variable in real time, depending on the temperature sensed by the temperature sensing device 4. In this embodiment, the flow rate control device 5 adjusts the flow ratio by adjusting the aforesaid distance, but the application is not limited thereto. All devices capable of performing flow rate control are applicable to the application.

Figure 3:
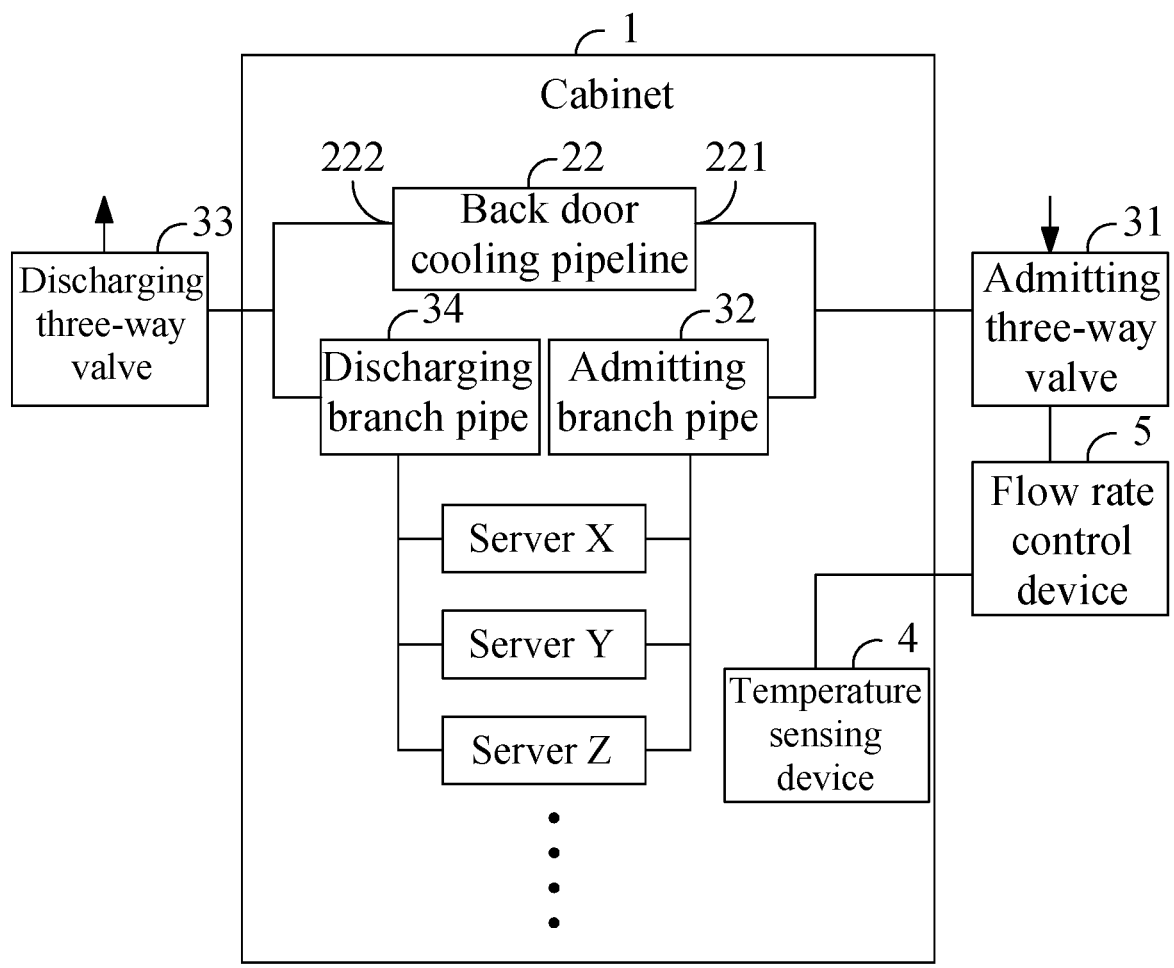
FIG. 3 is a block diagram of the smart flow rate control system for cooling server racks according to the second embodiment of the application.

In this embodiment, the flow rate control device 5 is disposed at the discharging three-way valve 33 to adjust the amount of water to be admitted into the discharging three-way valve 33 and thereby achieve flow rate control. However, the application is not limited thereto. Referring to FIG. 3, in the second embodiment of the application, a smart flow rate control system for cooling server racks 100a is characterized in that the flow rate control device 5 is disposed at the admitting three-way valve 31 to adjust the amount of water outputted from the admitting three-way valve 31 and thereby achieve flow rate control. The flow rate control device 5 may also be disposed at any position relative to the liquid cooling pipeline 3 to achieve flow rate control.

The smart flow rate control system for cooling server racks of the application is compatible with servers which come with different cooling devices and allows the heat generated by the servers to be quickly admitted into the rear door cooling pipeline 22 and carried away by the cooling liquid, so as to lower the temperature of the cabinet 1 and the machine room and lessen the workload of the air conditioning system. Therefore, the application embodies a technology of environmental protection and energy saving.

Figure 4:
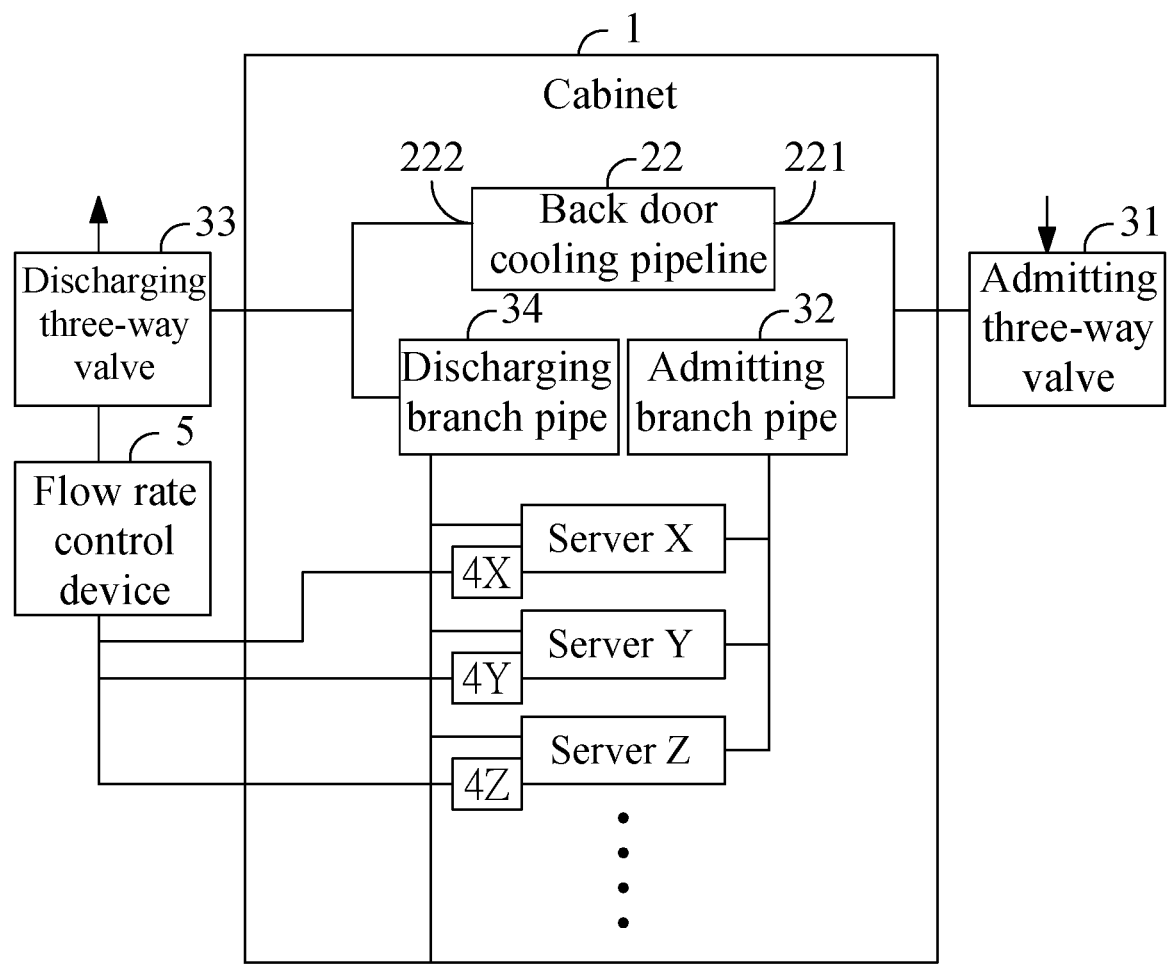
FIG. 4 is a block diagram of the smart flow rate control system for cooling server racks according to the third embodiment of the application.

Referring to FIG. 4, a smart flow rate control system for cooling server racks 100b in the third embodiment of the application is distinguished from the smart flow rate control system for cooling server racks 100 in the first embodiment by technical features as follows: the temperature sensing device 4 comprises a plurality of air temperature sensors 4X, 4Y, 4Z, etc. disposed in the receiving space S and corresponding in position to the servers X, Y, Z, etc., respectively, such that waste hot air current generated by the servers is precisely and instantly discovered.

Figure 5:
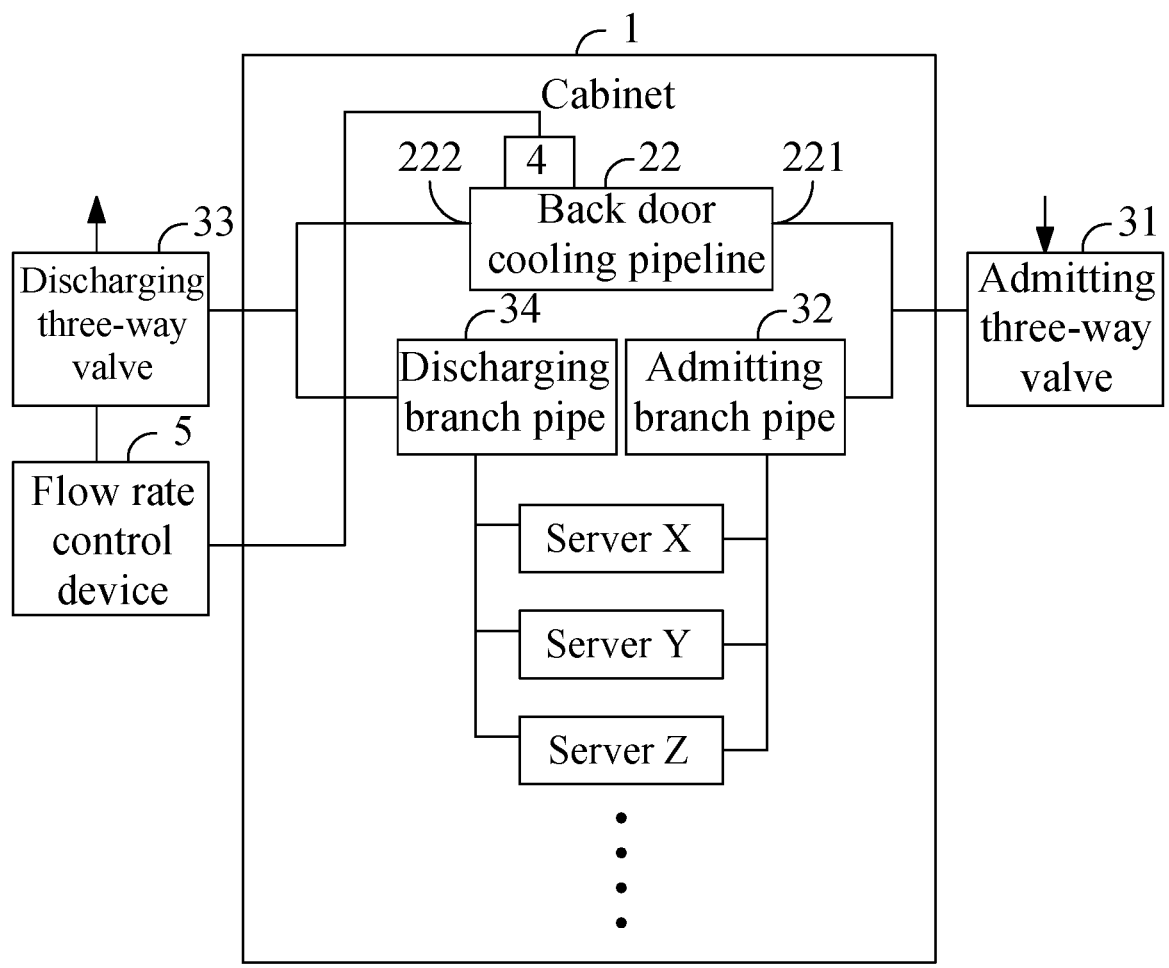
FIG. 5 is a block diagram of the smart flow rate control system for cooling server racks according to the fourth embodiment of the application.

Referring to FIG. 5, a smart flow rate control system for cooling server racks 100c in the fourth embodiment of the application is distinguished from the smart flow rate control system for cooling server racks 100 in the first embodiment by technical features as follows: the temperature sensing device 4 does not sense air temperature in the receiving space S but is disposed at the rear door cooling pipeline 22 (preferably positioned proximate to the rear door outlet 222) to sense water temperature of the rear door cooling pipeline 22; the flow rate control device 5 determines the flow ratio of the rear door cooling pipeline 22 according to the water temperature sensed by the temperature sensing device 4; for example, when the water temperature of the rear door cooling pipeline 22 is high, the flow ratio of the rear door cooling pipeline 22 is increased.

Figure 6:
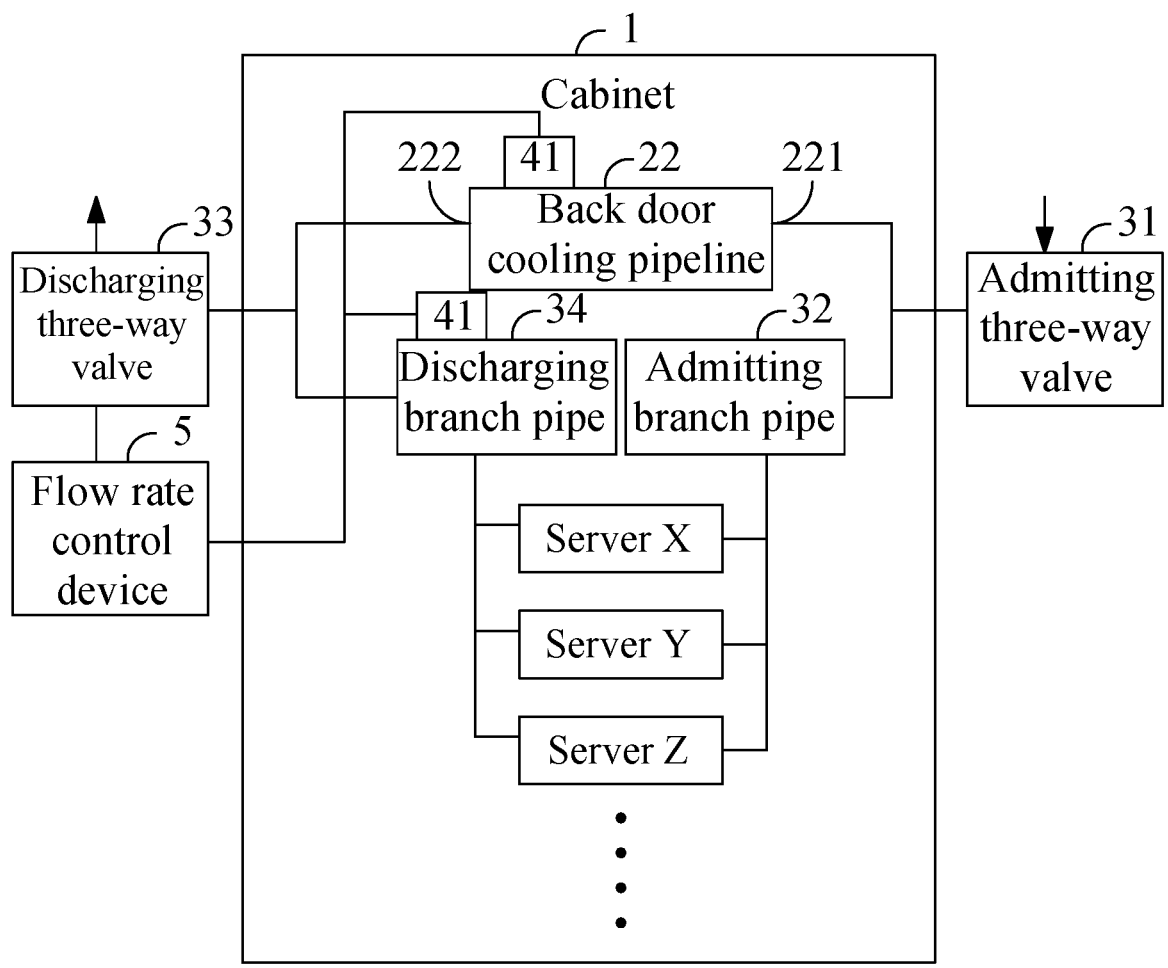
FIG. 6 is a block diagram of the smart flow rate control system for cooling server racks according to the fifth embodiment of the application.

Referring to FIG. 6, a smart flow rate control system for cooling server racks 100d in the fifth embodiment of the application is distinguished from the smart flow rate control system for cooling server racks 100c in the fourth embodiment by technical features as follows: the temperature sensing device 4 comprises a plurality of water temperature sensors 41 disposed at the rear door cooling pipeline 22 and the discharging branch pipe 34, respectively; the flow rate control device 5 compares the water temperature of the rear door cooling pipeline 22 with the water temperature of the discharging branch pipe 34 to determine the flow ratio of the rear door cooling pipeline 22.

The application is disclosed above by embodiments. However, the embodiments are illustrative of the application only, but shall not be interpreted as restrictive of the scope of the application. Hence, all equivalent changes and modifications made by persons skilled in the art to the embodiments shall fall within the scope of the application. Accordingly, the legal protection for the application shall be defined by the appended claims.

What is claimed is:

1. A smart flow rate control system for cooling server racks, comprising:
  a cabinet having a receiving space;
  a liquid cooling rear door comprising a door frame and a rear door cooling pipeline, the door frame being disposed on a side of the cabinet, the rear door cooling pipeline being mounted in place inside the door frame and having a rear door inlet and a rear door outlet, and the door cooling pipeline being configured to absorb the heat energy of the air in the receiving space for heat exchange;
  a liquid cooling pipeline comprising an admitting three-way valve, an admitting branch pipe, a discharging three-way valve and a discharging branch pipe, the admitting three-way valve receiving a liquid from an outside and delivering the liquid to the admitting branch pipe and the rear door inlet, and the discharging three-way valve receiving the liquid from the rear door outlet and the liquid from the discharging branch pipe, allowing the liquids to be joined before being discharged to the outside;
  a temperature sensing device; and
  a flow rate control device disposed at the liquid cooling pipeline, being in signal connection with the temperature sensing device, and determining a flow ratio of the rear door cooling pipeline according to a temperature sensed by the temperature sensing device,
  wherein when the temperature sensing device detects that the air temperature in the receiving space is higher than a threshold, the flow rate control device increases the flow ratio of the rear door cooling pipeline to balance the heat dissipation performance of two beat dissipation paths in the receiving space through the liquid cooling pipeline and through the air.

2. The smart flow rate control system for cooling server racks of claim 1, wherein the flow rate control device is disposed at the discharging three-way valve.

3. The smart flow rate control system for cooling server racks of claim 1, wherein the flow rate control device is disposed at the admitting three-way valve.

4. The smart flow rate control system for cooling server racks of claim 1, wherein the admitting three-way valve and the discharging three-way valve are disposed on an outer side of the cabinet.

5. The smart flow rate control system for cooling server racks of claim 1, wherein the admitting three-way valve and the discharging three-way valve are disposed in the receiving space.

6. The smart flow rate control system for cooling server racks of claim 1, wherein the door frame is pivotally rotatable relative to the cabinet.

7. The smart flow rate control system for cooling server racks of claim 1, wherein the temperature sensing device is disposed in the receiving space to sense air temperature in the receiving space.

8. The smart flow rate control system for cooling server racks of claim 7, wherein the temperature sensing device comprises a plurality of air temperature sensors disposed in the receiving space and corresponding in position to servers, respectively.

9. The smart flow rate control system for cooling server racks of claim 1, wherein the temperature sensing device is disposed at the rear door cooling pipeline to sense water temperature in the rear door cooling pipeline.

10. The smart flow rate control system for cooling server racks of claim 9, wherein the temperature sensing device comprises a plurality of water temperature sensors disposed at the rear door cooling pipeline and the discharging branch pipe, respectively.

* * * * *